Figure 1:
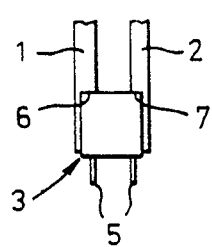

United States Patent [19]

van de Ven et al.

[11] Patent Number: 4,810,018
[45] Date of Patent: Mar. 7, 1989

[54] GRIPPING DEVICE

[75] Inventors: Johannes T. A. van de Ven; Adrianus J. P. M. Vermeer, both of Eindhoven, Netherlands

[73] Assignee: U.S. Philips Corporation, New York, N.Y.

[21] Appl. No.: 158,525

[22] Filed: Feb. 22, 1988

[30] Foreign Application Priority Data

Mar. 13, 1987 [GB] United Kingdom ............... 8705964

[51] Int. Cl.$^4$ ............................................. B25J 15/08
[52] U.S. Cl. ........................................ 294/88; 21/740; 21/743; 294/86.4; 294/106
[58] Field of Search .................... 29/740, 741, 743; 294/64.1, 2, 88, 86.4, 106

[56] References Cited

U.S. PATENT DOCUMENTS 4,727,647 3/1988 Matson et al. ................ 29/741 X
4,729,713 3/1988 Takaichi et al. .............. 294/64.1 X Primary Examiner—Carl E. Hall

[57] ABSTRACT

A gripping device for an apparatus for placing electronic and/or electrical components with terminal pins on a substrate comprises a pair of grippers (9 and 10) which are movable relative to one another by fluid-pressure operated means to close and open the jaws (12 and 13) of the grippers. The force for driving the pins of a component into the respective holes in the substrate is applied to the component through abutment means which are self-adjustable to accommodate differences in the heights of the components so that the gripper jaws can be brought to a constant level at the pick-up position each time and can be arranged to grip the component over areas which extend to the bottom of the body of the component to facilitate accurate positioning of the terminal pins in relation to the respective holes in the substrate when mounting the component. The abutment means comprise a spring-loaded, vertically disposed rod (18) which is movable vertically relative to the gripper jaws (12 and 13) and which abuts the upper side of the body of the component (16) as the gripping device is lowered to the pick-up position. As the gripper jaws close on the component a friction element (26) is moved to engage the side of the rod (18) to lock the rod in abutment with the component so that the rod can subsequently transmit the necessary force to the component to insert the terminal pins into the holes in the substrate. The friction element (26) is actuated by a piston (23) through a bell-crank lever (28), the piston being controlled by the valve means (not shown) which control the actuation of the grippers.

4 Claims, 1 Drawing Sheet

GRIPPING DEVICE

The invention relates to a gripping device for an apparatus for placing electronic and/or electrical components on a substrate, for example, a printed-circuit board. The invention relates particularly to a gripping device for an apparatus for placing components which are provided with pins for insertion in holes in the substrate. Such an apparatus is described in European Patent Application No. 0 183 301 and comprises means for moving a gripping device in orthogonal X and Y directions to bring a component held by the device to a position above that on the substrate where the component is to be placed, and in a Z direction at right angles to the X and Y directions for moving the gripping device first towards the component at the pick-up position and subsequently, after the required movement in the X and Y directions, towards the substrate to place the component on the substrate.

The invention relates more particularly to a gripping device comprising a pair of grippers, each of which comprises a gripper jaw and at least one of which is movable relative to the other by fluid-pressure operated means to close and open the jaws for gripping and releasing a component.

The invention is intended for use in an apparatus which is designed to handle electronic and/or electrical components of different sizes, more particularly different heights.

Figure 2:
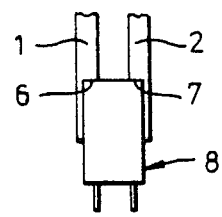

When a component is being placed on a substrate, a certain force is required to drive the pins of the component into the holes in the substrate. If the component is provided with snap-in members for securing the component to the substrate, that is to say, members which cooperate with a snap action with apertures in the substrate, an even greater force is required to press these members into engagement with the respective apertures. Clearly, the force with which the gripper jaws grip a component must be limited in order to avoid damaging the component. This limitation can result in the jaws slipping down the sides of a component if the resistance to the insertion of the pins of the component into the holes in the substrate, or the resistance to the engagement of the snap-in members, if provided, with the respective apertures in the substrate, is too high. To prevent this, abutment means may be provided for engagement with the upper side of the component. A known form of abutment means for this purpose consists of shoulders on the inner faces of the gripper jaws (as shown in FIGS. 1 and 2 of the accompanying drawings). Abutment means of this kind, which are fixed in relation to the gripper jaws, have a drawback in that they must be designed to be effective on the component of smallest height that the gripping device may be expected to handle. In other words, the distance between the abutment means and the ends of the gripper jaws must not be greater than the height of the smallest component measured from the lower to the upper side of the body of the component. The result of this is that when a component of substantially greater height is gripped by the gripper jaws, the engagement of the jaws on the component does not extend to the lower portion of the body of the component, and to facilitate accurate positioning of the pins of a component with respect to the holes in which they are to be inserted when the component is being placed on a substrate, it is desirable that the component be held as low down its body as possible.

Another drawback of fixed abutment means is that when picking up components having different heights the gripping device has to be lowered to different levels to bring the abutment means into engagement with the components, and the equipment needed for the programmed control of these movements of the gripping device can add considerably to the cost of the apparatus in which the gripping device is used.

It is an object of the invention to provide a gripping device which can be used for handling components of different heights but which does not suffer from the above drawbacks.

According to the invention there is provided a gripping device for an apparatus for placing electronic and/or electrical components on a substrate, the device comprising a pair of grippers, each of which comprises a gripper jaw and at least one of which is movable relative to the other by fluid-pressure operated means to close and open the jaws for gripping and releasing a component, and abutment means for cooperation with a component held between the grippper jaws, characterised in that the abutment means are movable relative to the gripper jaws in a direction which coincides at least substantially with the Z direction of movement of the gripping device when the device is fitted on said apparatus, the abutment means being subjected to a force for urging these means into engagement with a component held between the gripper jaws, and a locking device being provided which is actuated by fluid-pressure operated means and which is engageable with the abutment means to lock these means in any position in the range of movement thereof.

When the gripping device is moved in the Z direction, usually the vertical direction, towards the position at which it is to pick up a component, the locking device is inoperative so that when the abutment means have come into abutment with the component at the pick-up position the gripper jaws are free to move on down to a predetermined level at which they can grip the component at areas thereof extending down to, or almost down to, the bottom of the body of the component. Due to the self-adjustability of the abutment means to the height of the component, the predetermined level at which the jaws grip the component is constant regardless of the height of the component. When the jaws have gripped the component, or simultaneously with the closing of the jaws to grip the component, the locking device is operated to lock the abutment means in engagement with the component, so that when the gripping device is subsequently moved towards the substrate to mount the component, the force required for driving the pins of the component, and any snap-in members on the component, into the respective holes in the substrate will be applied through the locked abutment means.

In British Patent Specification No. 1,546,996 there is described a manually manipulated gripping device having an abutment member which is movable relative to a pair of gripping elements but which, unlike the abutment means in the present invention, cannot be locked at varying positions in its range of movement to suit components of varying heights. Moreover, this device is designed exclusively for use as a hand tool.

European Patent Application No. 0 178 167 describes a pick-and-place apparatus which picks up a component by means of a vertically disposed vacuum tube, the component being centred on the lower end of the tube by centering arms grouped around the end of the tube.

In this particular apparatus the vacuum tube is vertically adjustable relative to the centering arms to accommodate variations in the size and/or configuration of the components. With this type of apparatus the component is deposited on the substrate simply by interrupting the vacuum in the tube. The type of component which the apparatus is intended to handle does not have pins for insertion in holes in the substrate and therefore no force is required to mount the component. Consequently, the vacuum tube does not constitute abutment means for the transmission of force to the component.

A preferred embodiment of the present invention is characterized by valve means for controlling the fluid-pressure operated means by which the grippers are actuated and also the fluid-pressure operated means by which the locking device is actuated. This obviates the need for an additional control signal to initiate the actuation of the locking device.

The abutment means can be of simple construction. In one embodiment of the invention these means comprise a rod movable axially in the gripping device and urged by a spring in a direction to abut at one end a component held between the gripper jaws. In this embodiment the locking device may simply comprise a friction element for engagement with the side of the rod.

Figure 3:
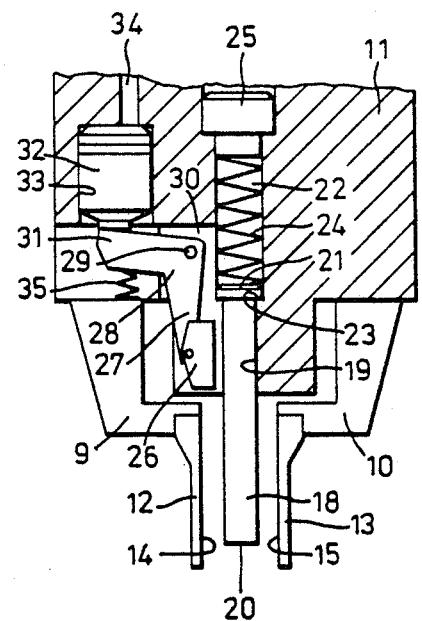
Figure 4:
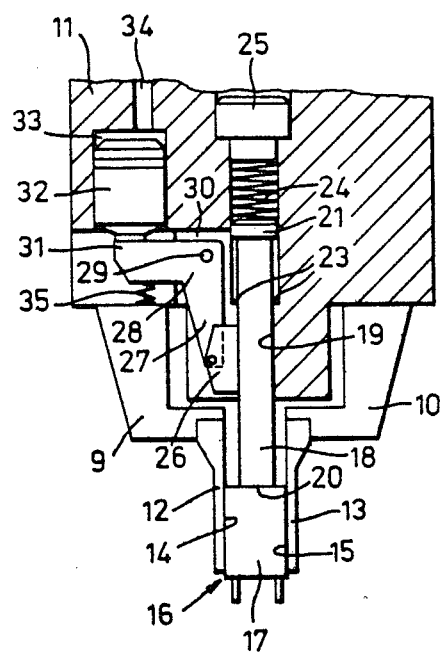

An embodiment of the invention will now be described by way of example with reference to the accompanying drawings, in which FIGS 1 and 2 are fragmentary elevations of a pair of known gripper jaws having fixed abutment means in the form of shoulders on the inner faces of the jaws, and FIGS. 3 and 4 are sectional elevations of the main part of a gripping device according to the invention, with the locking device in the inoperative and operative conditions respectively.

In FIG. 1 a pair of gripper jaws 1 and 2 of known form is shown gripping an electronic component 3 comprising a body 4 and terminal pins 5 projecting downwardly from the body. Shoulders 6 and 7 are formed on the inner faces of the jaws 1 and 2 for abutment with the upper side of the body 4 of the component to apply the necessary force to the component when the pins 5 are being inserted into holes in a substrate. The component 3 has a small height and the jaws 1 and 2 consequently engage the sides of the body 4 of the component over areas which extend practically to the bottom of the body 4. When the same jaws have to grip a component of substantially greater height, however, such as the component 8 in FIG. 2, the grip is applied only at the upper portion of body 4 and, as indicated earlier herein, such a grip does not facilitate the accurate positioning of the pins of the component with respect to the relevant holes in the substrate when mounting the component. Moreover, as can be seen by comparing FIGS. 1 and 2, since the pick-up position of the components is at a constant level the gripping device has t be lowered to different levels to bring the shoulders of the gripper jaws into abutment with the bodies of components of different heights at the pick-up position.

The gripping device according to the invention shown in FIGS. 3 and 4 comprises a pair of grippers 9 and 10 supported in a mounting 11 which is adapted to be fitted in an apparatus for placing electronic and/or electrical components on a substrate, for example, an apparatus similar to that described in the aforementioned European Patent Application No. 0 183 301. The grippers 9 and 10 comprise jaws 12 and 13 which have uninterrupted flat inner faces 14 and 15 for gripping a component, for example, the component 16 in FIG. 4, on two opposite sides of the body 17 of the component. The vertical dimension of the faces 14 and 15 is such that the component of greatest height that the gripping device may be expected to handle can be gripped by the faces 14 and 15 over areas which extend to the bottom of the body of the component.

The grippers 9 and 10 may both be movably supported in the mounting 11 for translational movement towards and away from one another to close and open the jaws 12 and 13. Alternatively, one gripper may be fixed in the mounting 11 and the other movably supported for movement towards and away from the fixed gripper. It will be assumed in the present case that both grippers are movable. The movement of the grippers is effected by fluid-pressure operated means which may be of any convenient known form and therefore need not be illustrated or described in detail. These means, which are accommodated in the mounting 11, may comprise, for example, a single- or double-acting piston or pistons operated by compressed air or vacuum or by hydraulic pressure. In the case of a single-acting piston or pistons, each of the grippers 9 and 10 (or the movable gripper if only one is movable) is moved in one direction by compressed air or vacuum or by hydraulic pressure and in the opposite direction by a spring; with a double-acting piston or pistons each gripper (or the movable gripper) is moved in both directions by compressed air or vacuum or by hydraulic pressure.

Between the gripper jaws 12 and 13 are disposed abutment means in the form of a rod 18 which is slidable axially in a vertical bore 19 in the mounting 11. The lower end face 20 of the rod serves as an abutment for cooperation with the upper side of the body of a component held between the jaws 12 and 13, as shown in FIG. 4. At its upper end the rod 18 has a flanged head 21 which is slidable in a cylindrical chamber 22 in the mounting 11 and which, as shown in FIG. 3, is cooperable with a shoulder 23 at the lower end of the chamber 22 to limit the downward movement of the rod 18. The rod is subjected to a downward force whereby it is urged into engagement at its lower end with a component held between the gripper jaws 12 and 13. This force may be provided by gravity; preferably, however, it is provided by a coil spring 24 held in compression between the head 21 of the rod 18 and the lower end face of a plug 25 which closes the upper end of the chamber 22. The limitation imposed by the shoulder 23 on the downward movement of the rod 18 is such that when the gripping device is lowered to the pick-up position to pick up the component of smallest height that the device has to handle, the lower end face 20 of the rod is low enough to engage the upper side of the body of this component.

Beside the rod 18 is a locking device comprising a friction element 26 pivotally mounted on one arm 27 of a bell-crank lever 28 which is pivotally supported by a horizontal pin 29 in a recess 30 in the mounting 11. The element 26 is frictionally engageable with the side of the rod 18 through an opening in the wall of the bore 19. The other arm 31 of the lever bears against the lower end of a piston 32 which is slidable in a vertical direction in a cylindrical chamber 33 in the mounting 11. Assuming that the fluid-pressure operated means by which the grippers 9 and 10 are actuated are such that the grippers are moved by compressed air to close the jaws 12 and 13 and by a spring or springs to open the jaws, a duct 34 is provided in the mounting 11 for the admission of compressed air to the upper end of the chamber 33 to move the piston 32 downwards, and at its lower end the chamber 33 is open to atmosphere and a coil spring 35 is arranged to exert an upward force on the piston 32. This spring also is arranged to hold the arm 31 of the lever 28 against the lower end of the piston 32 and thus acts on the piston through the lever arm 31. By means of a suitable control valve (not shown) the upper end of the chamber 33 can be placed in communication either with the source of compressed air from which the fluid-pressure operated means for actuating the grippers 9 and 10 are supplied or with atmosphere. The valve for controlling the actuation of the grippers can conveniently be used for this purpose. When compressed air is admitted to the upper end of the chamber 33 the piston 32 is moved downwards from the upper position shown in FIG. 3 to rotate the lever 28 in the counter-clockwise direction (as viewed in FIG. 3) against the resistance of the spring 35. This brings the friction element 26 into engagement with the rod 18, as shown in FIG. 4, to lock the rod against movement in the bore 19. This is the operative condition of the locking device. When the upper end of the chamber 33 is placed in communication with atmosphere again, the spring 35 rotates the lever 28 in the clockwise direction to disengage the friction element 26 from the rod 18 and also move the piston 32 back to its upper position in the chamber 33. This is the inoperative condition of the locking device.

When the gripping device moves downwards to the pick-up position the locking device is inoperative (FIG. 3) so that the rod 18 is free to slide in the bore 19. Consequently, when the lower end of the rod comes into abutment with the component which is at the pick-up position the rod is halted while the gripper jaws 12 and 13 continue to descend to the predetermined pick-up level, which is the same for all components irrespective of their height. In the pick-up position the gripper jaws are closed to grip the body of the component, and at the same time, assuming the actuation of the locking device is controlled by means of the valve which controls the actuation of the grippers 9 and 10, the locking device is actuated to bring the friction element 26 into engagement with the rod 18 to lock the rod in abutment with the component, as shown in FIG. 4. After movement in the horizontal X and Y directions to position the component above the substrate on which the component is to be placed, the gripping device is moved towards the substrate to mount the component in the prescribed position, and during this movement the force which has to be applied to the component to push the pins of the component into the relevant holes in the substrate is transmitted to the component through the locked rod 18. The gripper jaws 12 and 13 thus need have only a light grip on the component. When the component has been mounted the gripper jaws are opened to release the component and the locking device is restored to the inoperative condition to free the rod 18.

If, instead of being moved by compressed air to close the jaws 12 and 13 and by a spring or springs to open the jaws, the grippers 9 and 10 are arranged to be moved by a spring or springs to close the jaws and by compressed air to open them, the piston 32 and chamber 33 and the spring 35 can be modified and re-arranged so that the friction element 26 of the locking device is applied by spring force and released by compressed air. If the grippers are actuated by vacuum or hydraulic pressure the locking device also may be actuated by vacuum or hydraulic pressure.

What is claimed is:

1. A gripping device for an apparatus for placing electronic and/or electrical components on a substrate, the device comprising a pair of grippers, each of which comprises a gripper jaw and at least one of which is movable relative to the other by fluid-pressure operated means to close and open the jaws for gripping and releasing a component, and abutment means for cooperation with a component held between the gripper jaws, characterised in that the abutment means are movable relative to the gripper jaws in a direction which coincides at least substantially with the Z direction of movement of the gripping device when the device is fitted on said apparatus, the abutment means being subjected to a force for urging these means into engagement with a component held between the gripper jaws, and a locking device being provided which is actuated by fluid-pressure operated means and which is engageable with the abutment means to lock these means in any position in the range of movement thereof.

2. A gripping device as claimed in claim 1, characterised by valve means for controlling the fluid-pressure operated means by which the grippers are actuated and also the fluid-pressure operated means by which the locking device is actuated.

3. A gripping device as claimed in claim 1 or 2, characterised in that the abutment means comprise a rod movable axially in the gripping device and urged by a spring in a direction to abut at one end a component held between the gripper jaws.

4. A gripping device as claimed in claim 3, characterised in that the locking device comprises a friction element for engagement with the side of the rod.

* * * * *